United States Patent
Cho

(10) Patent No.: US 7,452,802 B2
(45) Date of Patent: Nov. 18, 2008

(54) METHOD OF FORMING METAL WIRING FOR HIGH VOLTAGE ELEMENT

(75) Inventor: Ihl Hyun Cho, Daejeon-si (KR)

(73) Assignee: MangnaChip Semiconductor, Ltd., Cheongju-si (KR)

( * ) Notice: Subject to any disclaimer, the term of this patent is extended or adjusted under 35 U.S.C. 154(b) by 357 days.

(21) Appl. No.: 11/030,786

(22) Filed: Jan. 7, 2005

(65) Prior Publication Data

US 2005/0153549 A1  Jul. 14, 2005

(30) Foreign Application Priority Data

Jan. 9, 2004    (KR) .................. 10-2004-0001654

(51) Int. Cl.
*H01L 29/40* (2006.01)
*H01L 21/4763* (2006.01)

(52) U.S. Cl. .............. 438/622; 438/623; 438/624; 438/625; 438/626; 257/758; 257/759; 257/760

(58) Field of Classification Search .............. None
See application file for complete search history.

(56) References Cited

U.S. PATENT DOCUMENTS

| | | | |
|---|---|---|---|
| 6,492,734 B2 * | 12/2002 | Watanabe | 257/758 |
| 7,001,843 B2 * | 2/2006 | Park | 438/669 |
| 2002/0068433 A1 * | 6/2002 | Trivedi et al. | 438/627 |
| 2002/0072223 A1 * | 6/2002 | Gilbert et al. | 438/629 |
| 2002/0111025 A1 * | 8/2002 | Weybright et al. | 438/689 |
| 2003/0119271 A1 * | 6/2003 | Aggarwal et al. | 438/381 |
| 2004/0140564 A1 * | 7/2004 | Lee et al. | 257/758 |
| 2004/0173908 A1 * | 9/2004 | Barth et al. | 257/760 |
| 2004/0232552 A1 * | 11/2004 | Wang et al. | 257/758 |
| 2005/0009323 A1 * | 1/2005 | Han | 438/636 |
| 2005/0127511 A1 * | 6/2005 | Yang et al. | 257/758 |
| 2006/0121740 A1 * | 6/2006 | Sakai et al. | 438/758 |

* cited by examiner

*Primary Examiner*—Carl Whitehead, Jr.
*Assistant Examiner*—James M Mitchell
(74) *Attorney, Agent, or Firm*—Marshall Gerstein & Borun LLP

(57) ABSTRACT

Disclosed herein is a method of forming metal wirings for high voltage elements. According to the present invention, after a copper film is formed, a wet etch process using an interlayer insulating film as an etch mask is performed to pattern the copper film. It is thus possible to form copper wirings for high voltage elements the width of which is very wide. Furthermore, a wet etch process using a chemical aqueous solution is performed instead of a copper polishing process. The cost for forming a metal wiring can be thus saved. Moreover, by controlling a wet etch time, the space between metal wirings, which is narrower than a width of the metal wiring, can be secured sufficiently.

4 Claims, 2 Drawing Sheets

METHOD OF FORMING METAL WIRING FOR HIGH VOLTAGE ELEMENT

BACKGROUND

1. Field of the Invention

The present invention relates to a method of forming metal wirings for high voltage elements, and more specifically, to a method of forming metal wirings of a semiconductor device for a high voltage power.

2. Discussion of Related Art

Recently, as semiconductor devices are gradually higher integrated and becoming high density, copper (Cu) having low resistance has been used in a metal wiring, which is formed by means of a damascene process. That is, the copper wirings is formed by depositing an interlayer insulating film, patterning the interlayer insulating film to fill the copper metal in an electroplating mode, and then polishing the copper metal.

However, in a metal wiring for a high voltage power, the pattern density of copper exceeds about 90% or more. Therefore, the space of the metal wiring is very narrower than that of an existing copper wirings. If existing damascene techniques are employed, the amount of etching in an oxide film becomes very high since the space between coppers is very narrow. Even upon etching, it becomes difficult to secure the space. Furthermore, even in a polishing process, there is a problem in that copper is seriously eroded in a chemical mechanical polishing (CMP) process because the pattern density of copper is high.

SUMMARY OF THE INVENTION

Accordingly, the present invention has been made in view of the above problems, and it is an object of the present invention to provide a method of forming metal wirings for high voltage elements in which the space between copper metals can be secured by forming a copper film on the entire surface and then patterning the copper film to form copper wirings.

To achieve the above object, according to an aspect of the present invention, there is provided a method of forming metal wirings for high voltage elements, comprising the steps of: forming a copper anti-diffusion metal film, a copper film, a first copper anti-diffusion insulating film and a first interlayer insulating film on a semiconductor substrate in which high voltage elements are formed, patterning the first interlayer insulating film and the first copper anti-diffusion insulating film, wherein the copper film in a region where copper wirings are not formed is opened, and removing the copper film and the copper anti-diffusion metal film by performing an etch process using a chemical aqueous solution in which the first inferlayer insulating film is used as an etch mask, thus forming the copper wirings.

Preferably, the etch process using the chemical aqueous solution is performed by using an etchant where sulfuric acid ($H_2SO_4$)/hydrogen peroxide ($H_2O_2$)/water ($H_2O$) are mixed, wherein the ratio of sulfuric acid to hydrogen peroxide is 2:1, 4:1 or 6:1, and the etch process is performed at a temperature ranging from 100 to 140° C. for 2 to 10 minutes.

Preferably, the etch process using the chemical aqueous solution is performed by using an etchant where ammonium hydroxide($NH_4OH$)/hydrogen peroxide($H_2O_2$)/water ($H_2O$) are mixed, wherein the ratio of ammonium hydroxide to hydrogen peroxide is 1:4 or 1:5, and the etch process is performed at a temperature ranging from 25 to 80° C. for 2 to 10 minutes.

Preferably, the etch process using the chemical aqueous solution is performed by using an etchant where hydrochloric acid (HCl)/hydrogen peroxide ($H_2O_2$)/water ($H_2O$) are mixed, wherein the ratio of hydrochloric acid to hydrogen peroxide is 1:1 or 1:2, and the etch process is performed at a temperature ranging from 25 to 80° C. for 2 to 10 minutes.

Preferably, the etch process using the chemical aqueous solution is performed by using an etchant where hydrogen fluoride (HF)/hydrogen peroxide ($H_2O_2$)/water ($H_2O$) are mixed, wherein the ratio of hydrogen fluoride to hydrogen peroxide is 1:5 or 1:10, and the etch process is performed at a temperature ranging from 15 to 35° C. for 2 to 10 minutes.

Preferably, the method further comprises the steps of, after the copper wirings are formed, forming a second copper anti-diffusion insulating film on the entire surface along the step of the surface, forming a second interlayer insulating film on the entire surface, patterning the second interlayer insulating film and the second copper anti-diffusion insulating film to form via holes, and burying the via holes with copper and then polishing the via holes.

Preferably, the method further comprises the step of, after the step (d) of forming the second copper anti-diffusion insulating film, performing a polishing process using the first interlayer insulating film as a stop layer.

DETAILED DESCRIPTION OF PREFERRED EMBODIMENTS

Now, the preferred embodiments according to the present invention will be described with reference to the accompanying drawings.

FIGS. 1a to 1d are sectional views for explaining a method of forming copper wirings according to an embodiment of the present invention.

Figure 1A:
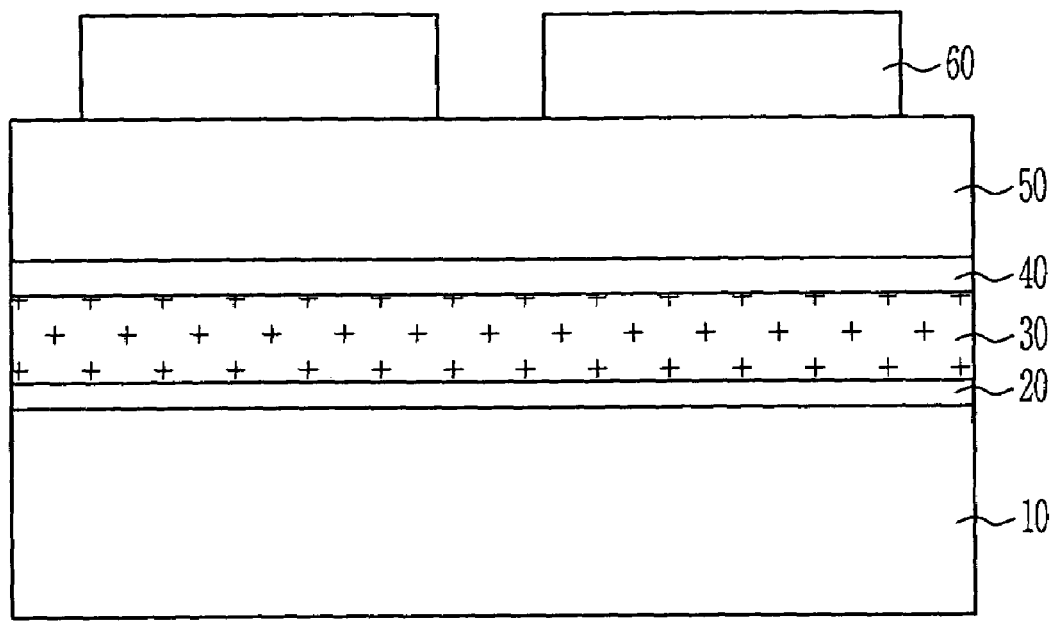
FIGS. 1a to 1d are sectional views for explaining a method of forming copper wirings according to an embodiment of the present invention.

Referring to FIG. 1a, a copper anti-diffusion metal film 20, a copper film 30, a first copper anti-diffusion insulating film 40 and a first interlayer insulating film 50 are sequentially formed on a semiconductor substrate 10 in which various elements (semiconductor structure) including high voltage elements (not shown) such as a well, an element isolation film, a transistor and a contact plug are formed. Photoresist patterns 60 for forming copper wirings are formed on the first interlayer insulating film 50.

In the above, a predetermined ion implant process is performed on the semiconductor substrate 10 to form the well (not shown). An element isolation process is performed to form the element isolation film (not shown) for electrical isolation between elements. A gate oxide film (not shown) for the high voltage elements and a conductive film (not shown) are formed and are then patterned to form a gate electrode (not shown) for high voltage power electronics. An ion implant process is then carried out to form a junction region. A spacer (not shown) is formed on the sidewall of the gate electrode. In this time, another ion implant process can be performed to form source/drain (not shown). An insulating film is deposited on the entire surface and is then patterned to form a contact hole. The contact hole can be filled with a copper film in order to form a copper contact plug (not shown). The copper anti-diffusion metal film 20 is then formed on the semiconductor substrate 10 in which various elements such as the high voltage elements are formed as such.

Preferably, the copper anti-diffusion metal film 20 can be formed by using at least one of Ta, TaN, Ta/TaN, Ti, TiN, Ti/TiN, W, WN and W/WN. It is also preferred that the first copper anti-diffusion insulating film 40 is formed by using at least one of SiN, SiC, SiCN and SiOCN. The first interlayer insulating film 50 is preferably formed by using an IMD (Inter-Metal Dielectric) oxide film.

Preferably, the copper film 30 can be formed by depositing a copper seed film (not shown) on the copper anti-diffusion metal film 20 and then performing a metal plating method. The copper seed film is deposited by means of a sputtering method. The copper film 30 is preferably formed to have a given thickness by performing an electroplating method.

The photoresist pattern 60 can be formed in such a manner that a photoresist is coated on the entire surface, and the photoresist remains in a region where the copper wirings will be formed and the space region between the metal wirings is opened, by means of a photolithography process using the photoresist mask. The photoresist pattern 60 is preferably formed in the same pattern as the metal wiring, which will be formed by a subsequent process, but has the region where the photoresist remains, the width of which is 5 to 200 times wider than that of the opened region. More preferably, the width of the region where the photoresist remains is 60 to 150 times wider than that of the opened region. This allows high voltage and high current to transmitted, lower resistance of the metal wiring, and improves reliability of wirings.

Figure 1B:
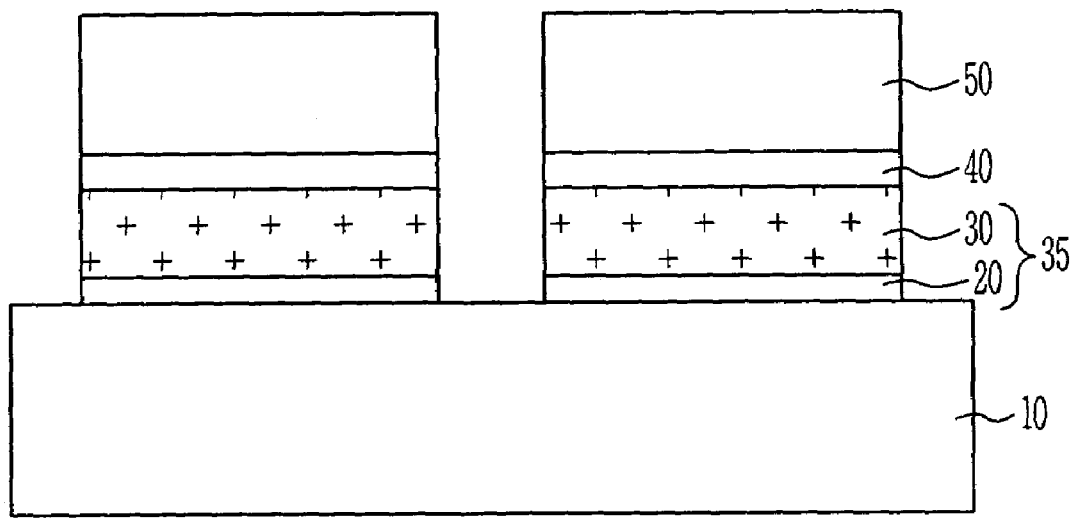

Referring to FIG. 1B, an etch process using the photoresist pattern 60 as an etch mask is performed to remove the first interlayer insulating film 50 and the first copper anti-diffusion insulating film 40. A predetermined strip process is performed to strip the photoresist pattern 60. A wet etch process using a chemical solution is carried out to etch the copper film 30 thus forming copper wirings 35.

The first interlayer insulating film 50 and the first copper anti-diffusion insulating film 40 are stripped by sequentially performing a dry etch process. In this time, the chemical solution is preferably an aqueous solution containing an oxidant such as $H_2O_2$, which can remove the copper metal.

Furthermore, the wet etch process using the chemical solution is performed for a predetermined time by using the first interlayer insulating film 50 as the etch mask, thereby removing the copper film 30.

In the above, the chemical solution may employ an etchant in which sulfuric acid ($H_2SO_4$)/hydrogen peroxide ($H_2O_2$)/water ($H_2O$) are mixed, wherein the ratio of sulfuric acid to hydrogen peroxide is preferably 2:1, 4:1 or 6:1. In this time, it is preferred that the wet etch process is performed under the condition where a temperature of the etchant (chemical solution) in which sulfuric acid/hydrogen peroxide/water are mixed is set to 100 to 140° C., and the semiconductor substrate is dipped into the etchant for 2 to 10 minutes.

Furthermore, the chemical solution may employ an etchant where ammonium hydroxide ($NH_4OH$)/hydrogen peroxide ($H_2O_2$)/water ($H_2O$) are mixed. The ratio of ammonium hydroxide to hydrogen peroxide is preferably 1:4 or 1:5. This can prevent excessive etch of the copper metal, which is caused by the ratio of ammonium hydroxide and hydrogen peroxide. It is preferred that the wet etch process is performed under the condition where a temperature of the etchant (chemical solution) where ammonia/hydrogen peroxide/water are mixed is set to 25 to 80° C. and the semiconductor substrate is dipped into the etchant for 2 to 10 minutes.

Furthermore, the chemical solution may employ an etchant in which hydrochloric acid (HCl)/hydrogen peroxide ($H_2O_2$)/water ($H_2O$) are mixed, wherein the ratio of hydrochloric acid to hydrogen peroxide is preferably 1:1 or 1:2. This can prevent excessive etch of the copper metal, which is caused by the ratio of hydrochloric acid and hydrogen peroxide. It is preferred that the wet etch process is performed under the condition where a temperature of the etchant (chemical solution) where hydrochloric acid/hydrogen peroxide/water are mixed is set to 25 to 80° C., and the semiconductor substrate is dipped into the etchant for 2 to 10 minutes.

Furthermore, the chemical solution may employ an etchant in which hydrogen fluoride (HF)/hydrogen peroxide ($H_2O_2$)/water ($H_2O$) are mixed, wherein the ratio of hydrogen fluoride to hydrogen peroxide is preferably 1:5 or 1:10. This can prevent excessive etch of the copper metal, which is caused by the ratio of ammonium hydroxide and hydrogen peroxide. It is preferred that the wet etch process is performed under the condition where a temperature of the etchant (the chemical solution) in which ammonia/hydrogen peroxide/water are mixed is set to 15 to 35° C., and the semiconductor substrate is dipped into the etchant for 2 to 10 minutes.

It is preferred that the time where the semiconductor substrate 10 is dipped in the etchant is performed until electrical isolation between the copper wirings 35 is completely accomplished. That is, it is possible to secure the space between the metal wirings, which is narrower than the width of the metal wiring by controlling the wet etch time. It is also possible to cut manufacture cost by forming the copper wirings by means of the wet etch process not forming the copper wirings by means of a damascene process.

Figure 1C:
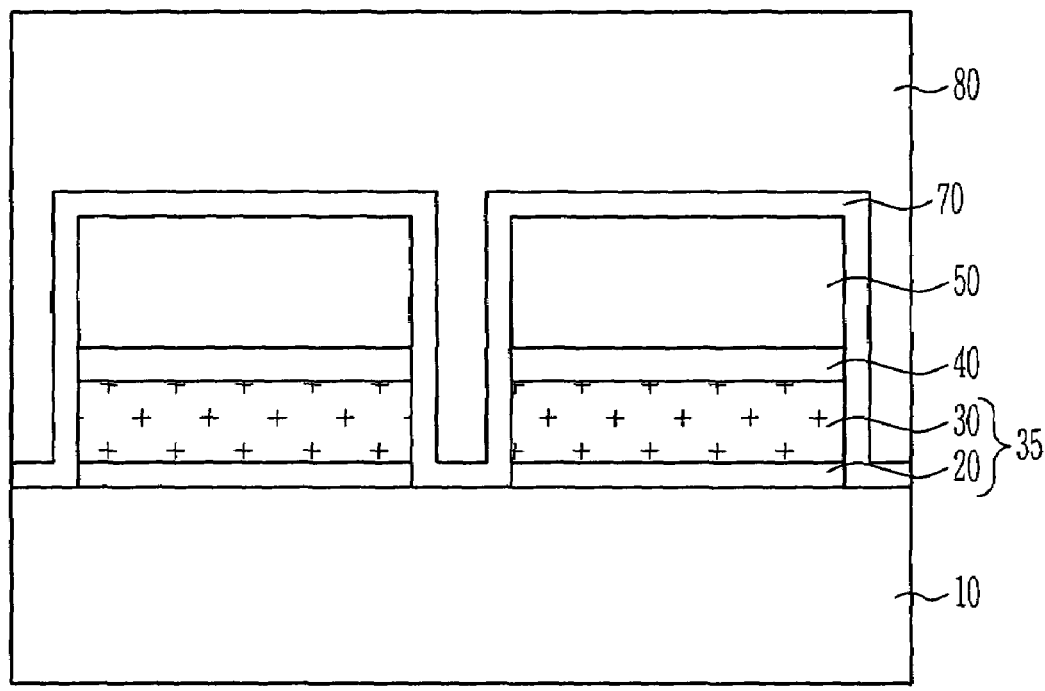

Referring to FIG. 1c, a second copper anti-diffusion insulating film 70 is formed on the entire surface along the step of the surface. After depositing a second interlayer insulating film 80 on the entire surface, a polishing process is performed to polish the second interlayer insulating film 80.

The second copper anti-diffusion insulating film 70 is preferably formed by using at least one of SiN, SiC, SiCN and SiOCN. The second copper anti-diffusion insulating film 70 is formed in the space between the copper wirings, and it can prevent copper atoms of the copper wirings 35, which is exposed by means of the wet etch process using the chemical solution, from diffusing. The second interlayer insulating film 80 is formed using an IMD oxide film. In this time, it is preferred that a polishing process using CMP is carried out so as to reduce the step caused by a region which is removed by means of the wet etch.

In this time, after the second copper anti-diffusion insulating film 70 is formed, a polishing process using the first interlayer insulating film 50 as a stop layer is performed, so that the second copper anti-diffusion insulating film 70 is formed only in the region between the copper wirings 35.

Figure 1D:
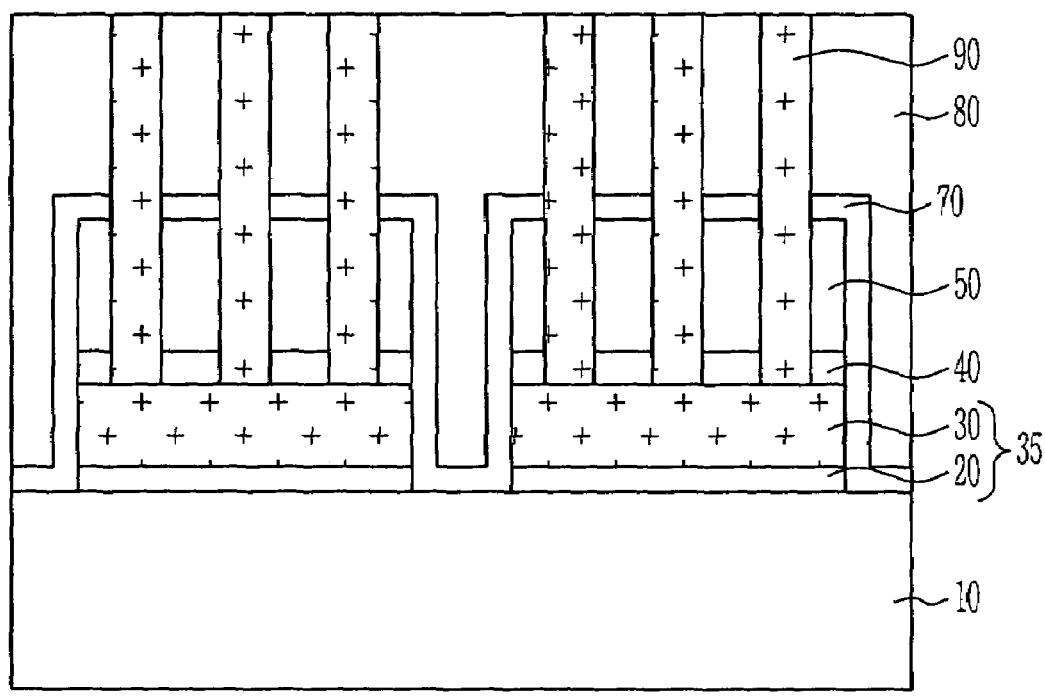

Referring to FIG. 1d, the second interlayer insulating film 80 and the second copper anti-diffusion insulating film 70 are patterned to form a via hole. The via hole is buried and polished by using a copper film, thus forming copper via plugs 90.

A photoresist is coated on the second interlayer insulating film 80. A photolithography process is then performed to form a photoresist pattern (not shown) through which some regions of the top of the copper wirings are opened. An etch process using the photoresist pattern as an etch mask is then performed to remove the second interlayer insulating film 80 and the second copper anti-diffusion insulating film 70, thereby forming a via hole. The photoresist pattern is then removed. After an anti-diffusion metal film (not shown) and a copper seed film (not shown) are formed on the entire surface, a copper plating film is formed by performing an electroplating method. A predetermined thermal treatment process is performed. Then, the copper plating film, the copper seed film and the anti-diffusion metal film on the second interlayer insulating film 80 are removed to form the copper via plugs 90.

According to the present invention described above, after a copper film is formed, a wet etch process using an interlayer insulating film as an etch mask is performed to pattern the copper film. It is thus possible to form copper wirings for high voltage elements the width of which is very wide.

Furthermore, a wet etch process using a chemical aqueous solution is performed instead of a copper polishing process. The cost for forming a metal wiring can be thus saved.

Moreover, by controlling a wet etch time, the space between metal wirings, which is narrower than a width of the metal wiring, can be secured sufficiently.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming metal wirings for high voltage elements, comprising:
    (a) forming a copper anti-diffusion metal film, a copper film, a first copper anti-diffusion insulating film, and a first interlayer insulating film over a semiconductor substrate in which high voltage elements are formed;
    (b) patterning the first interlayer insulating film and the first copper anti-diffusion insulating film, wherein the copper film is opened in a region where copper wirings are not formed; and
    (c) performing an etch process on the copper film and the copper anti-diffusion metal film using a chemical solution in which the first interlayer insulating film is used as an etch mask so as to form the copper wirings.

2. The method as claimed in claim 1, comprising performing the etch process using the chemical solution using an etchant where ammonium hydroxide($NH_4OH$)/hydrogen peroxide($H_2O_2$)/water($H_2O$) are mixed, wherein the ratio of ammonium hydroxide to hydrogen peroxide is 1:4 to 1:5, and the etch process is performed at a temperature ranging from 25° C. to 80° C. for 2 minutes to 10 minutes.

3. The method as claimed in claim 1, further comprising, after forming the copper wirings,
    (d) forming a second copper anti-diffusion insulating film on the semiconductor substrate including the first interlayer insulating film along a step of a surface;
    (e) forming a second interlayer insulating film on the second copper anti-diffusion insulating film;
    (f) patterning the second interlayer insulating film and the second copper anti-diffusion insulating film to form via holes; and
    (g) burying the via holes with copper and then polishing the via holes.

4. The method as claimed in claim 3, further comprising, after forming the second copper anti-diffusion insulating film, performing a polishing process using the first interlayer insulating film as a stop layer.

* * * * *